United States Patent [19]
Ueno

[11] Patent Number: 5,175,883
[45] Date of Patent: Dec. 29, 1992

[54] RECEIVING APPARATUS

[75] Inventor: Eiji Ueno, Saitama, Japan

[73] Assignee: Pioneer Electronic Corporation, Tokyo, Japan

[21] Appl. No.: 482,095

[22] Filed: Feb. 20, 1990

[30] Foreign Application Priority Data

Jul. 5, 1989 [JP] Japan .................... 1-173807

[51] Int. Cl.$^5$ ........................... H04B 1/10
[52] U.S. Cl. .................... 455/242.2; 455/247.1; 455/248.1; 358/174
[58] Field of Search ............. 455/245–250, 455/280, 290, 293, 311, 240.1, 242.2; 342/745; 358/174

[56] References Cited

U.S. PATENT DOCUMENTS

| | | | |
|---|---|---|---|
| 3,619,786 | 11/1971 | Wilcox | 455/249 |
| 4,370,520 | 1/1983 | Malchow | 455/246 |
| 4,393,513 | 7/1983 | Yokogawa et al. | 455/249 |
| 4,455,681 | 6/1984 | Wile | 455/246 |
| 4,509,206 | 4/1985 | Carpe et al. | 455/249 |
| 4,776,040 | 10/1988 | Ichikawa et al. | 455/247 |
| 4,811,423 | 3/1989 | Eastmond | 455/247 |
| 4,856,082 | 8/1989 | Kasa | 455/249 |
| 4,872,206 | 10/1989 | Graziadei et al. | 455/246 |
| 4,876,741 | 10/1989 | Jacobs et al. | 455/246 |

OTHER PUBLICATIONS

Turner, Chris: Modern hf Receiver Design, Part I, Communications Engineering International, Jun. 1982, S. 19, 22–23, 25, 27.

Primary Examiner—Reinhard J. Eisenzopf
Assistant Examiner—Lisa Charouel
Attorney, Agent, or Firm—Sughrue, Mion, Zinn, Macpeak & Seas

[57] ABSTRACT

A receiving apparatus according to the present invention comprises a high frequency amplifying circuit for amplifying a signal received from an antenna by a gain in accordance with a control signal, a frequency conversion circuit for converting the output frequency of the high frequency amplifying circuit, a narrow band filter for selectively passing therethrough the intermediate frequency signal components of the output of the frequency conversion circuit, and control signal generating circuit for generating a control signal in accordance with the output level of the frequency conversion circuit. The control signal generating circuit is so constructed that the control signal generating circuit outputs the control signal only when the output signal level of the frequency conversion circuit is higher than a level in accordance with the level of the narrow band filter.

11 Claims, 3 Drawing Sheets

RECEIVING APPARATUS

BACKGROUND THE INVENTION

The present invention relates to a receiving apparatus and more particularly to a receiving apparatus having an AGC (Automatic Gain Control) function.

FIG. 5 illustrates a well known receiving apparatus having an AGC function. In FIG. 5, an RF (radio frequency) signal received from an antenna is inputted into an antenna tuning circuit 2 through a variable attenuator 1. The output of the tuning circuit 2 is amplified by an RF amplifier 3 and is then fed to an RF tuning circuit 4 to selectively receive a desired RF signal. The RF signal is mixed by a mixer 5 with a local frequency signal from a local oscillator 6 for frequency conversion. The output of the mixer 5 is applied to an IF (intermediate frequency) tuning circuit 7 which outputs only an IF signal. The IF signal is then supplied to an IF amplifier (not shown) through an IF narrow band filter 8.

The IF signal outputted from the IF tuning circuit 7 is supplied to a level detector 10 in a control signal generating circuit 9. The level detector 10 is so constructed that a level detection signal is outputted in accordance with the level of the IF signal outputted from the IF tuning circuit 7. The output of the level detector 10 is supplied as an AGC signal through a switch 11 to the variable attenuator 1 and the RF amplifier 3. The switch 11 is arranged, for example, to become ON in response to an ON command of a "high level." The output of a comparator 12 is supplied to the ON command input terminal of the switch 11. A reference voltage Vr is supplied to an inverting input terminal of the comparator 12. The output of a level detector 13 is supplied to a positive input terminal of the comparator 12. The level detector 13 is constructed to generate a detection signal in accordance with the level of the IF signal through the IF narrow band filter 8.

With the arrangement described above, a so-called wideband AGC is effected where an AGC signal is produced in accordance with the output level of the IF tuning circuit 7 having a wide frequency band, and the AGC signal controls the attenuation factor of the variable attenuator 1 and the gain of the RF amplifier 3. Generally, the wideband AGC can prevent intermodulation interference due to the beat components produced by a plurality of interference signals whose beat components fall within the bandwidth of the desired signal when the plurality of interference signals coexist in the RF amplifier 3. However, the signal level of the desired signal is decreased together with the interference signals due to the AGC operation to cause so-called desensitization in which the receiver becomes unable to receive the desired signal if the level of the desired signal is low. If a level of the IF signal passing through the IF narrow band filter 8, that is a level of the desired signal, is detected by the level detector 13 and the output of the level detector 13 is less than the reference voltage Vr, the comparator 12 outputs no ON command which makes the switch 11 ON. Thus, the switch 11 remains OFF causing AGC to be disabled. This prevents desensitization.

That is, in the prior art receiver, if the desired signal exists in the output of the IF tuning circuit 7, a level of a wideband output of a front end which is the output level of the IF tuning circuit increases with increasing signal level of the received RF signal as shown in a solid line in FIG. 6. When the output level of the IF narrow band filter 8 increases to a level higher than the reference voltage Vr, the switch 11 becomes ON so as to close the wideband AGC loop. At this time, if the output level of the IF tuning circuit 7 is high, the attenuation of the attenuator 1 and the gain of the RF amplifier 3 are controlled to perform the AGC operation, thereby maintaining the wideband output level of the front end substantially constant.

Conversely, if the desired signal does not exist in the output of the IF tuning circuit 7, the AGC operation is not initiated even when the received signal level increases as shown in a dash-dot line but the level of the wideband output of the front end or the interference signal increases in accordance with the level of the received signal.

As described above, in the prior art receiver, when the desired signal is low in level, AGC will not be effected even if the interference signals exist in the vicinity band of the desired signal. Thus, if the interference signals are very high in level, the prior art receiver suffers from a problem of resulting in further radio interference and noise.

SUMMARY OF THE INVENTION

The present invention was made in view of the above described respects and an object of the invention is to provide a receiving apparatus capable of preventing the occurrence of radio interference and noise while exhibiting the desensitization improving effect when the incoming signals are high in level.

A receiving apparatus according to the present invention comprises a high frequency amplifying means for amplifying a signal received from an antenna by a gain in accordance with a control signal, a frequency conversion means for converting the output frequency of the high frequency amplifying means, a narrow band filter for selectively passing therethrough the intermediate frequency signal components of the outputs of the frequency conversion means, and a control signal generating means for generating a control signal in accordance with the output level of the frequency conversion means. The control signal generating means is so constructed that the control signal generating means outputs the control signal only when the output signal level of the frequency conversion means is higher than a level in accordance with the level of the narrow band filter.

DETAILED DESCRIPTION OF PREFERRED EMBODIMENT

The present invention will now be described in detail by way of example with reference to FIGS. 1-4.

Figure 1:
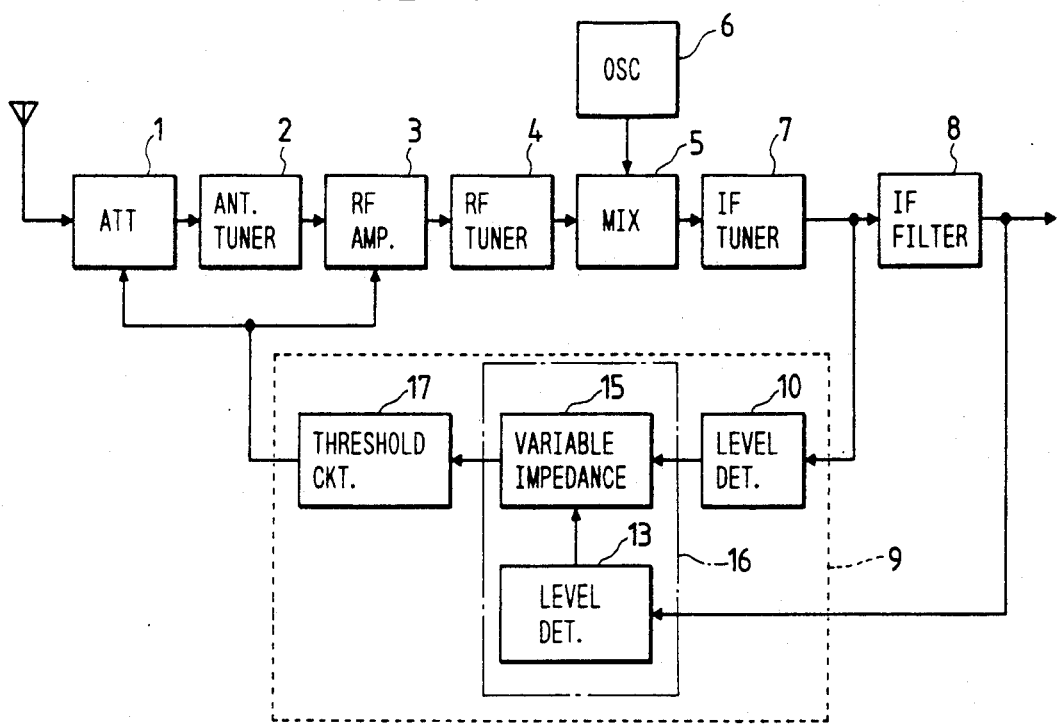
FIG. 1 is a block diagram for showing an embodiment of the present invention.
Figure 5:
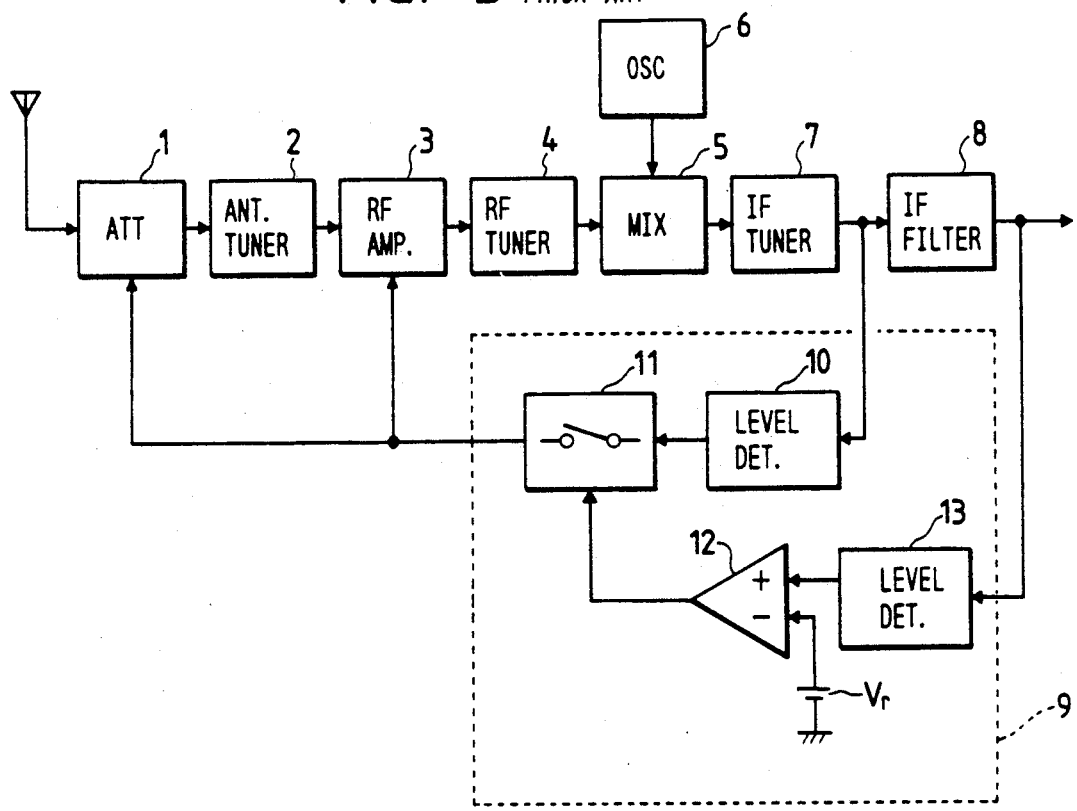
FIG. 5 is a block diagram showing a prior art receiving apparatus.
Figure 6:
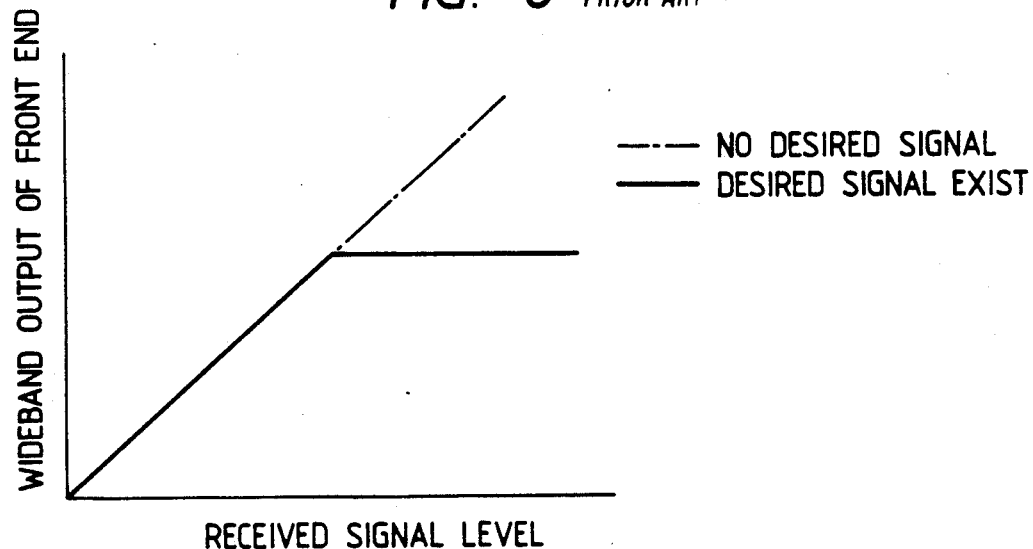
FIG. 6 is a graph for showing the operation of the prior art apparatus in FIG. 5.

In FIG. 1, an attenuator 1, an antenna tuning circuit 2, an RF amplifier 3, an RF tuning circuit 4, a mixer 5, a local oscillator 6, an IF tuning circuit 7, an IF narrow band filter 8, and a control signal generating circuit 9 are connected in a manner similar to that in FIG. 5. In the control signal generating circuit 9 according to the invention, the output of the IF tuning circuit 7 is supplied to a level detector 10. The level detector 10 is arranged to generate a detection signal in accordance with the output signal level of the IF tuning circuit 7 just as in the receiving apparatus shown in FIG. 5. The level detector 13 is arranged such that it generates the detection signal in accordance with the level of the output of the IF narrow band filter 8.

The detection signal from the level detector 10 is supplied to a variable impedance circuit 15. The variable impedance circuit 15 has a variable impedance which goes high, for example, when the detection signal from the level detector 13 is higher than a predetermined level. The variable impedance circuit 15 is constructed to transfer the detection signal from the level detector 10 through the variable impedance as a transmission characteristic to the succeeding stage. The level detector 13 and the variable impedance circuit 15 form a variable characteristics relay means 16.

The output of the variable impedance circuit 15 is supplied to a threshold circuit 17 as an output means. The threshold circuit 17 amplifies and outputs the output of the variable impedance circuit 15 only when the output level of the variable impedance circuit 15 is higher than the threshold level. The output of the threshold circuit 17 is supplied as an AGC signal outputted from the control signal generating circuit 9 to the variable attenuator 1 and the RF amplifier 3.

When the output level of the IF tuning circuit 7 becomes high level, the level of detection signal from the level detector 10 also becomes high level. Then, the level of the output signal from the variable impedance circuit 15 to which the detection signal is supplied from the level detector 10, will also go high. When the output level of the variable impedance circuit 15 becomes higher than the threshold level of the threshold circuit 17, the AGC signal which is obtained by amplifying the output of the variable impedance circuit 15 is outputted from the threshold circuit 17, thereby effecting the AGC operation.

The impedance of the variable impedance circuit 15 will be high when the output level of the IF narrow band filter 8 is higher than a predetermined level, whereas the impedance will be low when the output level is lower than the predetermined level. When the impedance of the variable impedance circuit 15 is low, the rate of the change in level of the output signal from the variable impedance circuit 15 to the change in level of the detection signal from the level detector 10 becomes small. Thus, it will be difficult for the output level of the variable impedance circuit 15 to exceed the threshold level of the threshold circuit 17, retarding the AGC operation. The variable characteristics relay means 16, which is constructed of the variable impedance circuit 15 and the level detector 13, functions to cause the operating point of AGC to change in accordance with the output level of the IF narrow band filter 8.

If the desired signal exists in the output of the IF tuning circuit 7, an increase in output level of the IF narrow band filter 8 causes an increase in impedance of the variable impedance circuit 15 so that the operating point of AGC is lowered. The wideband output level of the front end, that is the output level of the IF tuning circuit 7, will increase with increasing received signal level as depicted by the solid line in FIG. 2. When the level of the received signal reaches a relatively lower level $V_1$, the output level of the variable impedance circuit 15 becomes higher than the threshold level of the threshold circuit 17. This causes the AGC signal, which is obtained by amplifying the output of the variable impedance circuit 15, is outputted from the threshold circuit 17, thereby maintaining a substantially constant signal level of the wideband output of the front end.

If the desired signal does not exist in the output of the IF tuning circuit 7, the output level of the IF narrow band filter 8 remains low, which causes the impedance of the variable impedance circuit 15 to also remain low so that the operating point of AGC is shifted to a higher level. As a result, the wideband output level of the front end i.e., the output of the IF tuning circuit 7 will increase with increasing received signal level as shown by the dash-dot line in FIG. 2. When the received signal level reaches a level $V_2$ higher than $V_1$, the output level of the variable impedance circuit 15 becomes higher than the threshold level of the threshold circuit 17. This causes the AGC signal, which is obtained by amplifying the output of the variable impedance circuit 15, is outputted from the threshold circuit 17, thereby maintaining the substantially constant signal level of the wideband output of the front end.

In this construction, where the level of the desired signal is low, AGC is not performed maintaining desensitization effect even when the level of the interference signals is relatively high; where the level of the desired signal is low but the level of the interference signals is very high, AGC is carried out preventing the occurrence of radio interference and noise.

Figure 3:
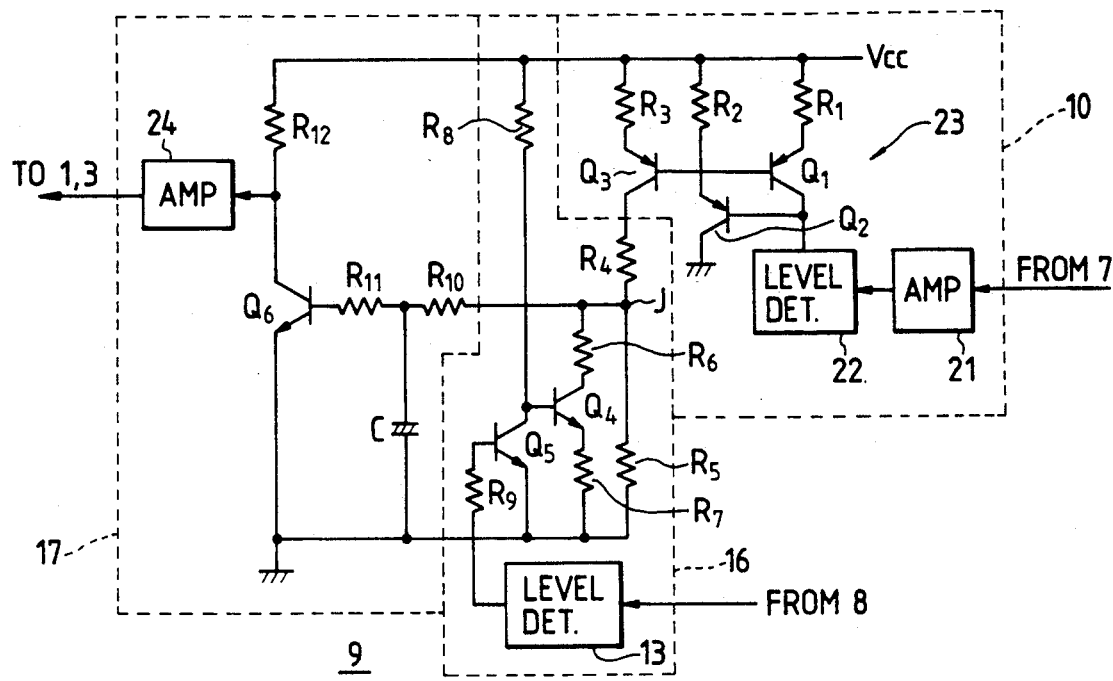
FIG. 3 is a circuit block diagram showing a specific construction of an AGC voltage generating circuit 9 of the apparatus in FIG. 1.

FIG. 3 is a block diagram for showing a specific construction of the control signal generating circuit 9. In FIG. 3, the output of the IF tuning circuit 7 is supplied to a level detecting circuit 22 through an amplifier 21 in the level detector 10. The level detecting circuit 22 is arranged to sink current in accordance with the output of the amplifier 21. The collector of a transistor $Q$ and the base of a transistor $Q_2$ are connected to the output terminal of the detecting circuit 22. A power supply voltage Vcc is applied to the emitter of the transistor $Q_1$ through a resistor $R_1$ and to the emitter of the transistor $Q_2$ through a resistor $R_2$. The base of the transistor $Q_1$ is connected to the emitter of the transistor $Q_2$ and to the base of the transistor $Q_3$. To the emitter of the transistor $Q_3$ is applied the voltage Vcc through a resistor $R_3$. These transistor $Q_1$ to $Q_3$ and the resistors $R_1$ to $R_3$ form a current mirror circuit 23. The output of the level detector 10 is actually the output of the current mirror circuit 23.

A resistor $R_4$ and a resistor $R_5$ are connected in series between the ground and the collector of the transistor $Q_3$ which is an output terminal of the current mirror circuit 23. The collector of the transistor $Q_4$ is connected to the junction point J of the resistors $R_4$ and $R_5$ through a resistor 6. A resistor $R_7$ is connected between the ground and the emitter of the transistor $Q_4$. The collector output of the transistor $Q_5$ is supplied to the base of transistor $Q_4$. The power supply voltage Vcc is applied to the collector of the transistor $Q_5$ through a resistor $R_8$. The output of the level detector 13 which detects the output level of the IF narrow band filter 8 is supplied to tho base of the transistor $Q_5$ through the resistor 8.

The signal appearing on the junction point J of the series-connected $R_4$ and $R_5$ is supplied as the output of the variable characteristics means 16 to the base of the transistor $Q_6$ through resistor $R_{10}$ and $R_{11}$. A smoothing capacitor C is connected between the ground and the junction point of the series connected resistors $R_{10}$ and $R_{11}$. The transistor $Q_6$ is grounded at its emitter, and is connected at its collector to the power supply voltage Vcc through a resistor $R_{12}$. The collector output of the transistor $Q_8$ is supplied as the AGC signal to the variable attenuator 1 and the RF amplifier 3 through a buffer amplifier 24.

In the arrangement described above, when the output level of the IF tuning circuit 7 increases, the current flowing into the level detecting circuit 22 becomes large causing the input current to the current mirror circuit 23 to become large. This causes the collector current of the transistor $Q_3$, which is the output current of the mirror circuit 23, to increase so that a signal in accordance with the output current of the current mirror circuit 23, i.e., a signal in accordance with the output of the IF tuning circuit appears on the junction point J of the series-connected $R_4$ and $R_5$.

When the potential at the point J is greater than 0.7V, the transistor $Q_6$ in the threshold circuit 17 comes into active state thereof to effect the AGC operation.

If the resistance of the resistor $R_7$ is negligibly small relative to the resistor $R_6$, then the potential at the point J is dependent on the resistor $R_5$ and the output current of the current mirror 23 when the transistor $Q_4$ is off state. Conversely, if the transistor $Q_4$ is on, then the output current of the current mirror 23 also flows into the resistor $R_6$ so that the potential at the point J become dependent on the combined resistance of the resistors $R_5$ and $R_6$ and the output current of the current mirror 23. The combined resistance of the parallel-connected resistors $R_5$ and $R_6$ is small as compared to the resistor $R_5$, thus when the transistor $Q_4$ becomes on, the potential at the point J decreases, thereby preventing the AGC operation.

When the transistor $Q_5$ becomes off, the transistor $Q_4$ becomes on, i.e., when the output level of the IF narrow band filter 8 decreases to cause the output of the level detector 13 to be less than 0.7V.

Figure 4:
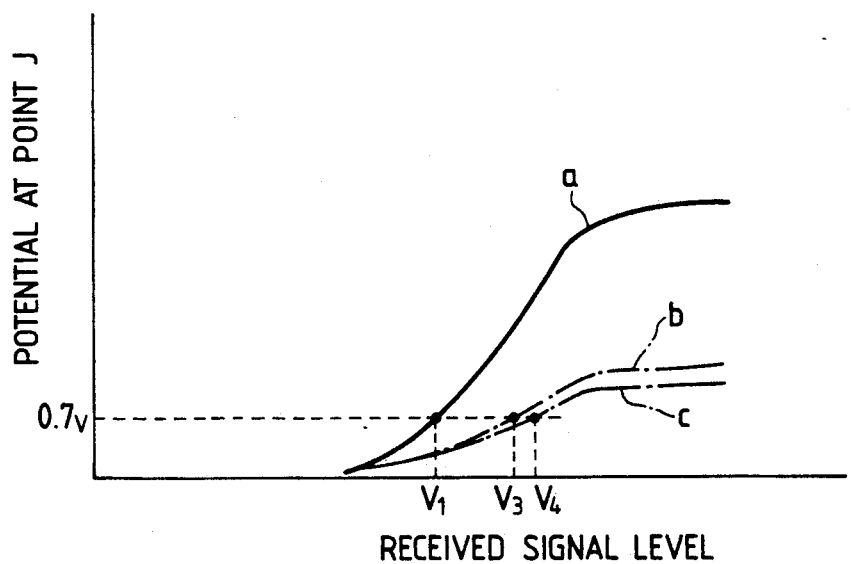
FIG. 4 is a graph for showing the operation of the circuit in FIG. 3.

FIG. 4 illustrates the relation between the potential at the point J of the series connected resistors $R_4$ and $R_5$ and the received signal level when the transistor $Q_6$ is forcibly made off. In FIG. 4, the solid line a shows the potential at the point J when the transistor $Q_4$ is off while the dash-dot lines b and c show the potential at the point J when the transistor $Q_4$ is on. It should be noted that the dash-dot line b represents a case where the resistors $R_5$ and $R_6$ are 6.8 kohms and 3.3 kohms, respectively and the dash-dot line c indicates a case where the resistors $R_5$ and $R_6$ are 6.8 kohms and 2.2 kohms, respectively. $V_1$ indicates the received signal level at which AGC is initiated when the transistor $Q_4$ is off, $V_3$ represents the received signal level at which AGC is being 3.3 kohms, and $V_4$ represents the received signal level at which AGC is initiated when the transistor $Q_4$ is off with the resistor $R_6$ being 2.2 kohms.

As is apparent from FIG. 4, when the output level of the IF narrow band filter 8, i.e., the level of the desired signal is low, the AGC operation is performed at a higher operating point, as opposed the prior art apparatus in which the AGC loop will be open. The rate of the increase of the AGC operating point is dependent on the resistance of the resistor $R_6$.

Figure 2:
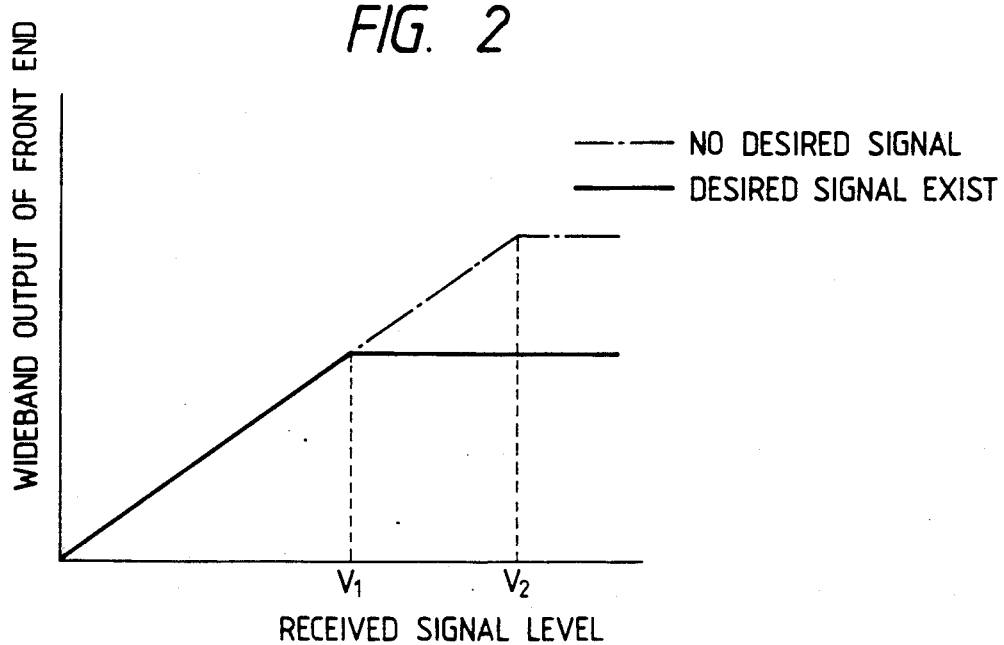
FIG. 2 is a graph showing the operation of the apparatus in FIG. 1.

Thus, where the desired signal exists in the outputs of the IF turning circuit 7, the output level of the IF tuning circuit 7 increases with increasing received signal level as shown by the solid line in FIG. 2. When the received signal level exceeds the relatively low level $V_1$, the potential at the point J exceeds 0.7V, which causes the transistor $Q_6$ to be in active state thereof. This allows AGC to be in operation so as to hold the wideband output level of the front end at a substantially constant level.

Where the desired signal does not exist in the output of the IF tuning circuit 7, the output level of the IF narrow band filter 8 remains low causing the transistor $Q_5$ to remain off and the transistor $Q_4$ to remain on. This causes AGC to operate at a higher level. As a result, when the received signal level exceeds a relatively high level $V_2$ ($=V_3$ or $V_4$) as shown by the dash-dot line in FIG. 2, AGC starts to operate so that the wideband output level of the front end is held constant.

In the above-described embodiment, while the variable characteristics relay means includes the variable impedance circuit in which the impedance varies in accordance with the output level of the IF narrow band filter 8, the variable characteristics relay means may also be constructed using a variable attenuator circuit attenuation of which varies with the output level of the IF narrow band filter 8 or a variable gain amplifier in which the gain varies with the output level of the IF narrow band filter 8.

As mentioned above, a receiving apparatus according to the present invention, comprises: a high frequency amplifying means for amplifying the signal received through an antenna with a gain in accordance with a control signal, a frequency conversion means for frequency-converting the output frequency of the high frequency amplifying means, a narrow band filter for selectively passing therethrough the intermediate frequency signal component of the outputs of the frequency conversion means, and a control signal generating means for generating a control signal in accordance with the output level of the frequency conversion means. The control signal generating means is arranged to output the control signal only when the output signal level of the frequency conversion means is higher than the output level of the narrow band filter.

Thus, in the receiving apparatus according to the present invention, where the level of the desired signal is low, the automatic gain control is disabled even when the level of the interference signals is relatively high, still exhibiting desensitization improving effect in which desensitization can be prevented. Conversely, where the level of the desired signal is low but the level of the interference signals is very high, the automatic gain control is performed to prevent the occurrence of the radio interference and noise.

What is claim is:

1. A receiving apparatus having an automatic gain control (AGC) function comprising:
high frequency amplifying means for amplifying a signal received through an antenna by a gain dependent on a control signal;
frequency conversion means for frequency-converting an output of said high frequency amplifying means;

bandpass filter for selectively passing therethrough an intermediate frequency signal component of an output of said frequency conversion means; and control signal generating means for generating said control signal in accordance with an output level of said frequency conversion means, said control signal generating means including an AGC operating point changing means for changing an AGC operating point in accordance with a signal output from said bandpass filter.

2. A receiving apparatus as claimed in claim 1, wherein said control signal generating means includes:

level detection means for outputting a level detection signal in accordance with the output level of said frequency conversion means;

variable characteristics relay means for relaying said level detection signal through a transmission characteristic in accordance with the signal output of said bandpass filter; and output means for outputting said control signal having a level in accordance with a level of the level detection signal which passes through said variable characteristics relay means only when said level of said level detection signal is higher than a predetermined threshold level.

3. A receiving apparatus as claimed in claim 2, wherein said variable characteristics relay means has at least one of impedance, attenuation, and gain which varies in accordance with the signal output of said band pass filter.

4. A receiving apparatus as claimed in claim 1 wherein said AGC operating point changing means includes:

means for raising the AGC operating point when a desired signal is not present at the signal output of said bandpass filter; and means for lowering the AGC operating point when a desired signal is present at the signal output of said bandpass filter.

5. A receiving apparatus as claimed in claim 4 wherein said means for raising the AGC operating point involves lowering the impedance of a variable impedance circuit, and said means for lowering the AGC operating point involves raising the impedance of a variable impedance circuit.

6. A receiving apparatus having an automatic gain control (AGC) function comprising:

front end portion having antenna tuning stage, radio frequency tuning stage, local oscillator stage and mixing stage for frequency converting a received signal from an antenna to an intermediate frequency signal;

IF filter for selectively passing therethrough only a desired IF signal component from said IF signal converted in said front end portion; and control signal generating means for generating a control signal in accordance with an output of said front end portion, said control signal generating means including an AGC operating point changing means for changing an operating point in accordance with a signal output from said IF filter;

wherein a gain of said front end portion is controlled by said control signal.

7. A receiving apparatus as claimed in claim 6, wherein said control signal generating means includes:

level detection means for outputting a level detection signal in accordance with the output of said front end portion;

variable characteristics relay means for relaying said level detection signal through a transmission characteristics in accordance with the signal output of said IF filter; and output means for outputting said control signal having a level in accordance with a level of the level detection signal which passes through said variable characteristics relay means only when said level of said level detection signal is higher than a predetermined threshold level.

8. A receiving apparatus as claimed in claim 7, wherein said variable characteristics relay means has at least one of impedance, attenuation, and gain which varies in accordance with the signal output of said IF filter.

9. A receiving apparatus as claimed in claim 6 wherein said AGC operating point changing means includes:

means for raising the AGC operating point when a desired signal is not present at the output of said IF filter; and means for lowering the AGC operating point when a desired signal is present at the output of said IF filter.

10. A receiving apparatus as claimed in claim 9 wherein said means for raising the AGC operating point involves lowering the impedance of a variable impedance circuit, and said means for lowering the AGC operating point involves raising the impedance of a variable impedance circuit.

11. A receiving apparatus having an automatic gain control (AGC) function comprising:

high frequency amplifying circuit for amplifying a signal received through an antenna by a gain dependent on a control signal;

frequency conversion circuit for frequency-converting an output of said high frequency amplifying circuit;

bandpass filter for selectively passing therethrough an intermediate frequency signal component of an output of said frequency conversion circuit; and control signal generating circuit for generating said control signal in accordance with an output level of said frequency conversion circuit, said control signal generating circuit including an AGC operating point changing circuit for changing an AGC operating point in accordance with a signal output from said bandpass filter.

* * * * *